United States Patent
Tojo et al.

(10) Patent No.: US 6,239,443 B1
(45) Date of Patent: *May 29, 2001

(54) APPARATUS FOR EMITTING A BEAM TO A SAMPLE USED FOR MANUFACTURING A SEMICONDUCOR DEVICE

(75) Inventors: Toru Tojo, Ninomiya-machi; Ryoichi Hirano, Yokohama; Susumu Saito, Tokorozawa; Hitoshi Suzuki; Kazuo Abe, both of Kawaguchi; Shinya Watanabe, Tokyo, all of (JP)

(73) Assignees: Kabushiki Kaisha Toshiba, Kawasaki; Topcon Corporation, Tokyo, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/040,286

(22) Filed: Mar. 18, 1998

(30) Foreign Application Priority Data

Mar. 19, 1997 (JP) ................................................ 9-066702

(51) Int. Cl.⁷ ................................................ G01N 21/86
(52) U.S. Cl. ................................................ 250/548; 356/401
(58) Field of Search ................................ 250/548, 559.3, 250/557, 559.29; 356/399, 400, 401, 375, 376; 355/53, 55

(56) References Cited

U.S. PATENT DOCUMENTS

| 4,698,513 | 10/1987 | Tojo et al. . |
| 5,151,754 | 9/1992 | Ishibashi et al. . |
| 5,602,399 | * 2/1997 | Mizutani ............................... 250/548 |
| 5,783,833 | * 7/1998 | Sugaya et al. ........................ 250/548 |

FOREIGN PATENT DOCUMENTS

| 61-210901 | 9/1986 | (JP) . |
| 10-26513 | 1/1998 | (JP) . |

* cited by examiner

Primary Examiner—John R. Lee
Assistant Examiner—Kevin Pyo
(74) Attorney, Agent, or Firm—Oblon, Spivak, McClelland, Maier & Neustadt, P.C.

(57) ABSTRACT

An apparatus for emitting a beam to a sample used for manufacturing a semiconductor device in order to process the sample, includes a chamber having an opening, a moving mechanism provided in the chamber, for moving the sample in X-, Y- and Z-axis directions, and a beam emitting system associated with the opening of the chamber, for emitting a beam to the sample in the chamber. The apparatus further includes an optical position detector for guiding a coherent light beam into the chamber and detecting a light beam output from the chamber. The optical position detector has light beam generating unit for generating a coherent light beam to be emitted to the sample, light-receiving unit for receiving a light beam from a surface of the sample, and converting unit for converting a signal output from the light-receiving unit into signals in the X-, Y- and Z-axis directions.

8 Claims, 7 Drawing Sheets

APPARATUS FOR EMITTING A BEAM TO A SAMPLE USED FOR MANUFACTURING A SEMICONDUCOR DEVICE

BACKGROUND OF THE INVENTION

The present invention relates to an apparatus for emitting a beam to a sample used for manufacturing a semiconductor device, which has a mask forming electron beam exposure apparatus, a laser exposure apparatus, a stepper, and an electron beam direct patterning apparatus as a typical example and, more particularly, to an apparatus mounted with an optical position detector (an XYZ sensor) for determining the position of a sample, such as a semiconductor wafer and a mask, in three directions of x, y and z, without contacting the sample.

Recently the width of a circuit line required for semiconductor devices has been narrowed more and more in accordance with high degree of integration of an LSI. To manufacture such a semiconductor device, there is a method of aligning several tens of types of original pattern (reticle or mask) of a desired circuit pattern with an exposure area of a wafer with high precision and transferring it thereto, and a method of forming a pattern directly on a wafer. The wafer is finely processed through various processes.

As an apparatus for emitting a beam such as a light beam and an electron beam to a sample used for manufacturing a semiconductor device, there are a mask forming electron beam exposure apparatus, a laser exposure apparatus, a stepper, an electron beam direct patterning apparatus and the like. In this apparatus, a variation in a direction z, which is the same as the optical axis direction of a processing beam incident upon the sample face, has to be measured with high precision, because the processing beam has to be focused exactly on the sample face. Further, it is necessary to measure directions x and y, which are normal to the optical axis direction of the processing beam, using a mark in order to determine the accurate position of the sample face.

Conventionally, the above measurements are achieved independently and separated from each other. In the stepper, since a mark is located on the periphery of a semiconductor element, the position of the sample face is determined on the periphery, while that of the focus (z direction) for transferring an element pattern is done in the central part of the device. In the electron beam exposure apparatus, the position of a mark is generally determined using an electron beam (Jpn. Pat. Appln. KOKAI Publication No. 58-223326).

Since, however, resist is greatly damaged by accelerating an acceleration voltage of the recent electron beam, the high-precision measurement of the electron beam is considered to be questionable. Moreover, the electron beam has a problem of causing a drift by charge-up to make it difficult to accurately determine the position of a sample. Thus the development of a position determination technique in the optical system is expected.

Though, for example, Jpn. Pat. Appln. KOKAI Publication No. 4-315904 discloses a technique capable of determining the z-direction, it does not report an apparatus mounted with a sensing device for determining the x- and y-directions at the same time. The above method of manufacturing a semiconductor device has a problem that each of the positions cannot be determined accurately unless the x-, y- and z-directions are measured simultaneously. This is because it is known that the current optical xy measurement device is varied with a variation in position of a mark in the z-direction.

An electron beam patterning apparatus, disclosed in Jpn. Pat. Appln. KOKAI Publication No. 7-82987, includes an optical position detector capable of optically determining a position of a mark. When the position cannot be determined using an electron beam, positioning is executed by the optical position detector based on data to form a pattern.

BRIEF SUMMARY OF THE INVENTION

It is accordingly an object of the present invention to provide an apparatus for emitting a beam to a sample related to the manufacture of a semi-conductor device, which is capable of exposure precision or processing precision by accurately determining the positions of the sample in x-, y- and z-directions at the same time.

To attain the above object, there is provided an apparatus for emitting a beam to a sample used for manufacturing a semiconductor device in order to process the sample, the apparatus comprising:

a chamber having an opening;

a moving mechanism provided in the chamber, for moving the sample in X-, Y- and Z-axis directions;

a beam emitting system associated with the opening of the chamber, for emitting a beam to the sample in the chamber; and an optical position detector for guiding a coherent light beam into the chamber and detecting a light beam output from the chamber, the optical position detector including light beam generating means for generating a coherent light beam to be emitted to the sample, light-receiving means for receiving a light beam from a surface of the sample, and converting means for converting a signal output from the light-receiving means into signals in the X-, Y- and Z-axis directions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Prior to the description of the embodiments of the present invention, the principle of the invention will be explained first. The present invention is directed to an apparatus, such as a mask forming electron beam exposure apparatus, a laser exposure apparatus, a stepper, and an electron beam direct patterning apparatus, for emitting a beam to a sample used for manufacturing a semiconductor device. This apparatus is mounted with an optical XYZ sensor.

The sensing method of the present invention is based on the technique (Japanese Patent Application No. 8-183554) which has been already proposed by the inventors of the present invention. Unlike the technique, however, the present invention provides a technique in which a single positioning mark is provided on the face of a sample, at least three coherent fluxes are emitted thereto, and their reflected, diffracted light beams are received, thereby to measure a difference in phase between the light beams.

In order to detect the above light phase difference, an opto-heterodyne detection method is adopted. The main optical element is disposed in the air outside a vacuum chamber, and the fluxes for detection are guided into the vacuum inside the vacuum chamber. The optical axis of the fluxes can be controlled in the air. Further, since the positions in x, y and z directions and those in x and y directions using a patterning/processing beam, can be determined at the same time, the positions in the x and y directions can easily be corrected. If an electric element is provided to store a corrected value, the positions in the x and y directions can always be measured correctly.

According to the present invention described above, even though the sample face is varied in its height direction, the positions in the x and y directions can correctly be determined. Since, moreover, a laser beam is used as a light source, no drift is caused even by charge-up, with the result that stable positional signals in the x, y and z directions can be generated, and a drift of an electron beam (processing beam) can exactly be measured, which was conventionally impossible.

According to the present invention, the number of marks is one, and all the positions in the x, y and z direction can be determined at once, so that the processing beam and x, y and z outputs can be corrected easily and correctly. Since, moreover, the arrangement of marks can be read exactly, the patterning precision (processing precision) can be measured correctly.

The preferred embodiments of the present invention according to the above principle, will be described with reference to the accompanying drawings.

(First Embodiment)

Figure 1:
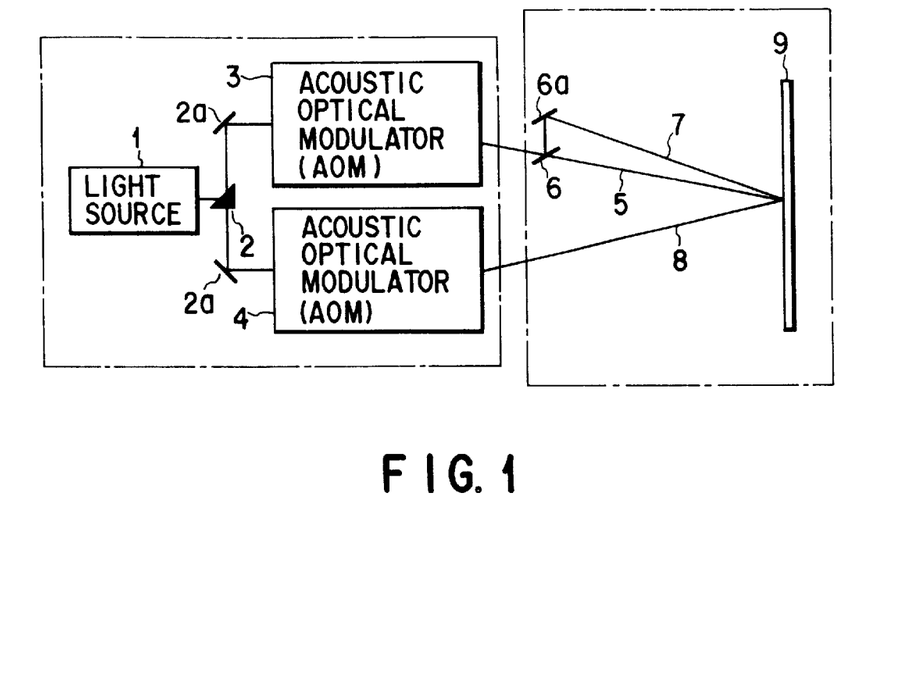
FIG. 1 is a block diagram illustrating an optical position detector according to a first embodiment of the present invention.
Figure 2:
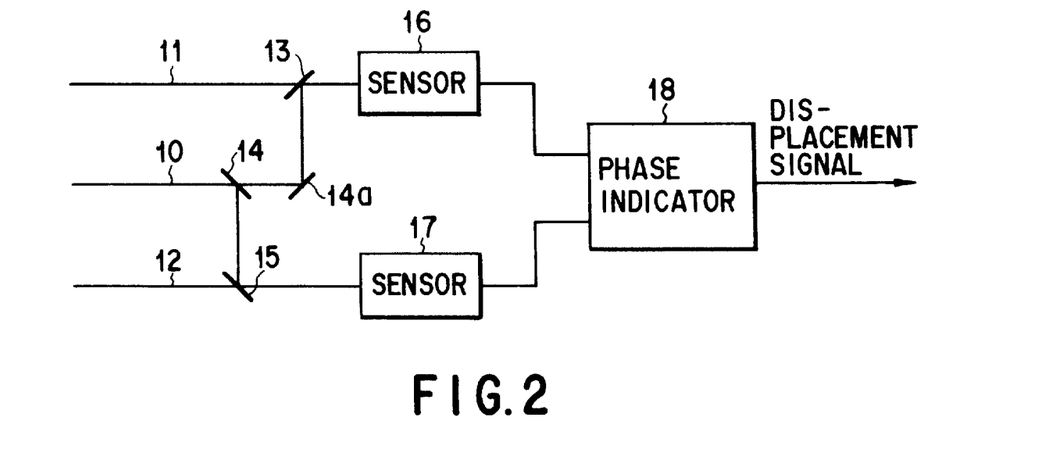
FIG. 2 is a schematic view showing the constitution of the light receiving side.
Figure 3:
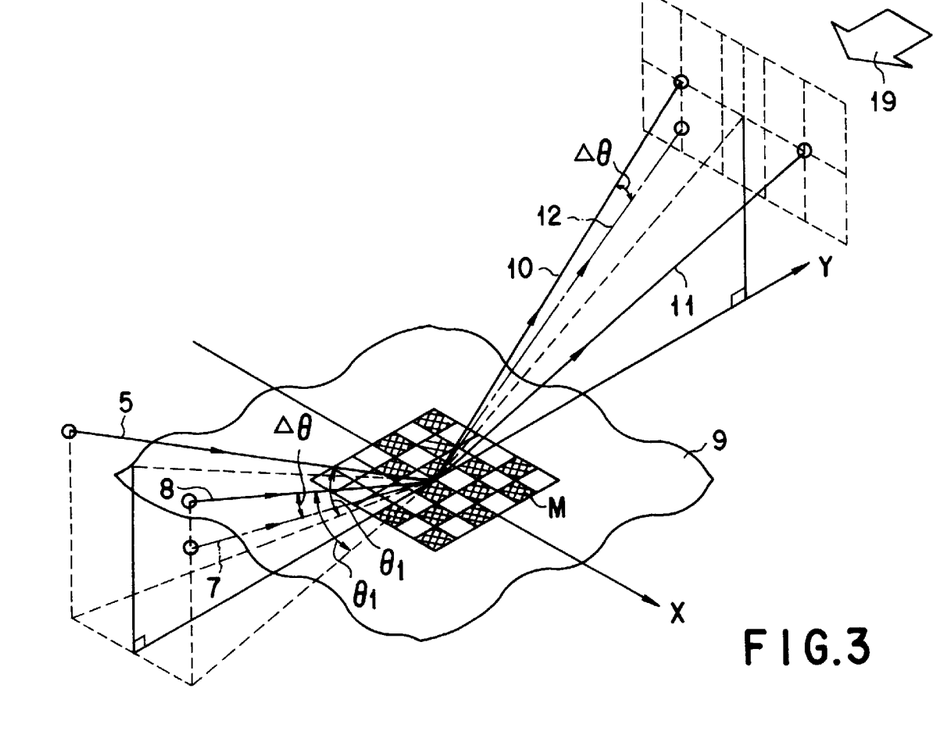
FIG. 3 is a perspective view showing a relationship between light incident upon the measurement face of a sample shown in FIG. 1 and light reflected therefrom.

An optical position detector (XYZ sensor) according to the first embodiment of the present invention will be described with reference to FIGS. 1 and 2. FIG. 1 is a schematic view of the structure of the sensor on the laser beam emitting side and FIG. 2 is a schematic view thereof on the light receiving side when the height of the measurement face of a sample is measured. FIG. 3 is a perspective view showing in detail the relationship between the light incident upon the measurement face of the sample and the light reflected thereby in the sensor of FIGS. 1 and 2.

In FIG. 1, a high coherent laser beam is emitted from a light source 1 and split into first and second fluxes by a beam splitter (half mirror) 2. The first and second fluxes are sent to acoustic optical modulators (AOM) 3 and 4 through mirrors 2a and modulated by frequencies $f_1$ and $f_2$ which are slightly different from each other. The flux emitted from the AOM 3 is split into fluxes 5 and 7 by a beam splitter 6, and the flux 7 is reflected by a mirror 6a. The AOM 4 emits a flux 8.

The fluxes 5, 7 and 8 is emitted to the measurement face of a sample 9 through a folded mirror and a lens (neither is shown). The fluxes 5 and 8 are emitted at a predetermined angle $\theta_1$ to the measurement face, while the flux 7 is emitted obliquely with a difference in incident angle $\Delta\theta$ between flux 7 and each of fluxes 5 and 8 (see FIG. 3).

The flux 5 and each of fluxes 7 and 8 are incident at angle of $\alpha$ symmetrically with regard to the plane defined by both the direction normal to the measurement face of the sample 9 and one displacement detection direction parallel with the measurement face.

Regular reflected light beams 12 and 10 of fluxes 7 and 8 are emitted with emission angle difference $\Delta\theta$ in their height direction as shown in FIG. 3, while regular reflected light beams 11 and 10 of fluxes 5 and 8 are emitted at the same emission angle in the height direction with an angle difference $2\alpha$ in the direction parallel with the measurement face of the sample 9.

As illustrated in FIG. 2, the fluxes 10 and 11 and the fluxes 10 and 12, which are reflected by the measurement face of the sample 9, are synthesized with each other using half mirrors 13 to 15 and a mirror 14a to allow sensors 16 and 17 to sense a beat caused by an interference of wave. The sensor 16 generates a height detection signal, while the sensor 17 does a reference signal. A phase difference between these signals is measured using a phase indicator 18 to produce a displacement signal, with the result that the height of the surface of the sample 9, which is proportionate to the phase difference, can be detected.

When the measurement face of the sample 9 is displaced in its height direction by Z, phase difference $\phi$ between two signals is expressed by the following equation:

$$\phi = 4\pi Z\{\cos\theta_1 - \cos(\theta_1 + \Delta\theta)\}/\lambda \tag{1}$$

where $\lambda$ is the wavelength of laser beam.

A diffraction grating for distributing diffracted light two-dimensionally, is formed as mark M in a flux irradiating position of the measurement face of the sample 9, as shown in FIG. 3. Since it is only the regular reflected light that is required for detecting the height of the measurement face, the mark M is unnecessary when only the height is detected.

Figure 4:
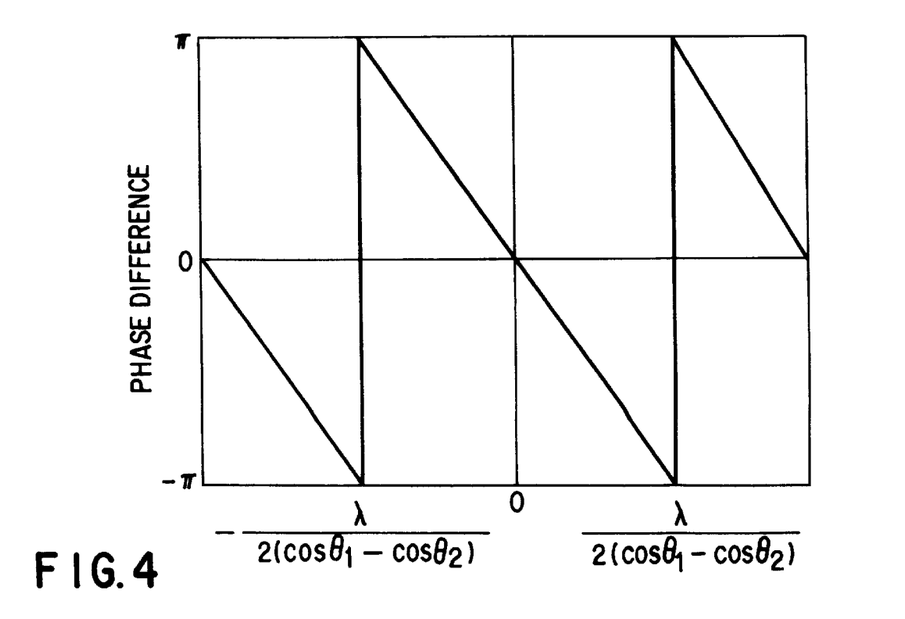
FIG. 4 is a diagram of phase variation characteristics obtained by measuring the height of the sample face.

FIG. 4 shows the phase difference characteristics obtained from the above equation (1). It is seen from equation (1) that the phase difference can be adjusted so as to change by $2\pi$ within a measurement range of Z by properly setting the value of $\{\cos\theta_1 - \cos(\theta_1 + \Delta\theta)\}/\lambda$. More specifically, the measurement range of Z can be varied by adjusting the incident angle difference Δθ. If, therefore, an incident angle changing mechanism for adjusting the incident angle difference Δθ, the measurement range of Z can be set freely.

The phase difference signal, reference signal and measurement signal are each light incident upon the surface of the sample 9. Even when resist is applied to the surface of the sample 9 to cause the surface condition to be varied, the same variation in the length of optical path affects all the signals. It is thus possible to detect only the variation in height of the measurement face of the sample 9 without any influence of the surface condition.

In order to determine a position in the direction parallel with the measurement face of the sample 9, the diffraction grating (mark M) is formed in the flux irradiating position of the measurement face as shown in FIG. 3.

Figure 5:
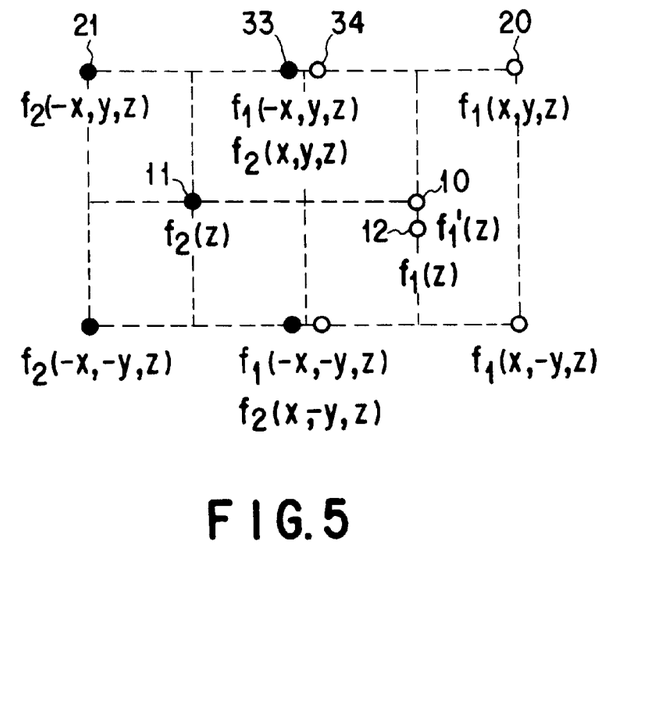
FIG. 5 is a diagram showing the distribution of diffracted light beams detected by the optical position detector of FIGS. 1, 2 and 3.

FIG. 5 shows the distribution of diffracted light beams obtained by the grating, which is viewed from the direction of arrow 19 in FIG. 3. Assuming that the pitch between gratings in the X direction and that between gratings in the Y direction are $P_x$ and $P_y$, respectively based on the coordinate system in FIG. 3, and the n-th diffraction angles of fluxes 10 and 11 in the X and Y directions are $\theta_x$ and $\theta_y$, the following two equations are given:

$$\sin \theta_x = \pm \lambda / P_x \qquad (2)$$

$$\sin \theta 1 - \sin \theta_y = \pm \lambda / P_y \qquad (3)$$

If the incident angle in the X direction is $\alpha$ ($\neq \theta_x$), the reflected, diffracted light beams (including regular reflected light) are not synthesized but can be taken in independently. Note the first one of the diffracted light beams. If the displacements of mark M in the X and Y directions are $\Delta_x$ and $\Delta_y$, respectively, phase variations $\phi_x$ and $\phi_y$ of the diffracted light beams are expressed as follows:

$$\phi_x = 2\pi \Delta_x / P_x \qquad (4)$$

$$\phi_y = 2\pi \Delta_y / P_y \qquad (5)$$

The phase is varied even with variations in height $Z(\phi_z)$.

For example, in diffracted light beam 21, phase variation $\phi(-1, 1)$ which is proportionate to the displacement of mark M is represented as follows:

$$\phi(-1, 1) = \phi_x + \phi_y + \phi_z \qquad (6)$$
$$= -2\pi \Delta_x / P_x + 2\pi \Delta_y / P_y + \phi_z$$

Since the diffracted light beam 21 is modulated by frequency $f_2$, the phase variation is expressed as $f_2(-x, y, z)$ for convenience's sake. If the diffracted light beam 21 is synthesized with a diffracted light beam 10 of $f_1'(z)$ to generate a beat signal, the phase variations $\phi_z$ of diffracted light beams 10 and 21 with respect to height A, are the same, so that the phase variation $\phi_b$ due to the displacement of mark M is expressed by the following equation:

$$\phi_b = \phi_x + \phi_y = -2\pi \Delta_x / P_x + 2\pi \Delta_y / P_y \qquad (7)$$

The phase variation $\phi_b$ is a function of only $\Delta_x$, $\Delta_y$.

Since, however, the mark M is displaced in whichever one of X and Y directions the phase is varied, the beat signal is not suitable as a displacement signal. Therefore, a beat signal generated by synthesizing diffracted light beams 11 and 20 in addition to the above beat signal.

Figure 6:
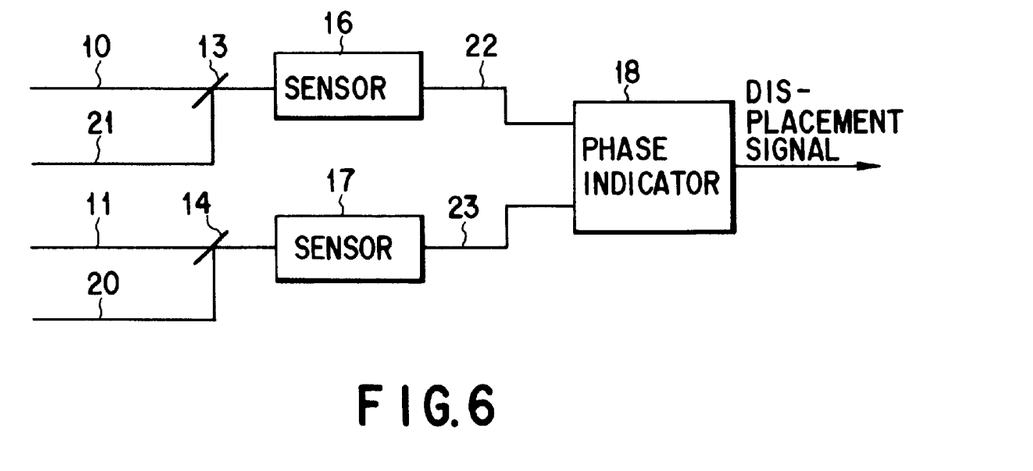
FIG. 6 is a schematic view of the constitution of a light-receiving side of the apparatus when the displacement in the Y direction is detected.

More specifically, as shown in FIG. 6, the diffracted light beams 10 and 21 are synthesized with each other by the half mirror 13 and supplied to the sensor 16, while the diffracted light beams 11 and 20 are synthesized with each other by the half mirror 14 and supplied to the sensor 17. The output signals of the sensors 16 and 17 are sent to the phase indicator 18 to produce a variation signal. A phase difference $\Delta_\phi$ between phase $\phi_1$ of beat signal 22 output from the sensor 16 and phase $\phi_2$ of beat signal 23 output from the sensor 17, is expressed as follows:

$$\Delta_\phi = \phi_1 - \phi_2 = 4\pi \Delta_y / P_y \qquad (8)$$

Thus, only the displacement in the Y direction can be detected by the phase indicator 18.

Figure 7:
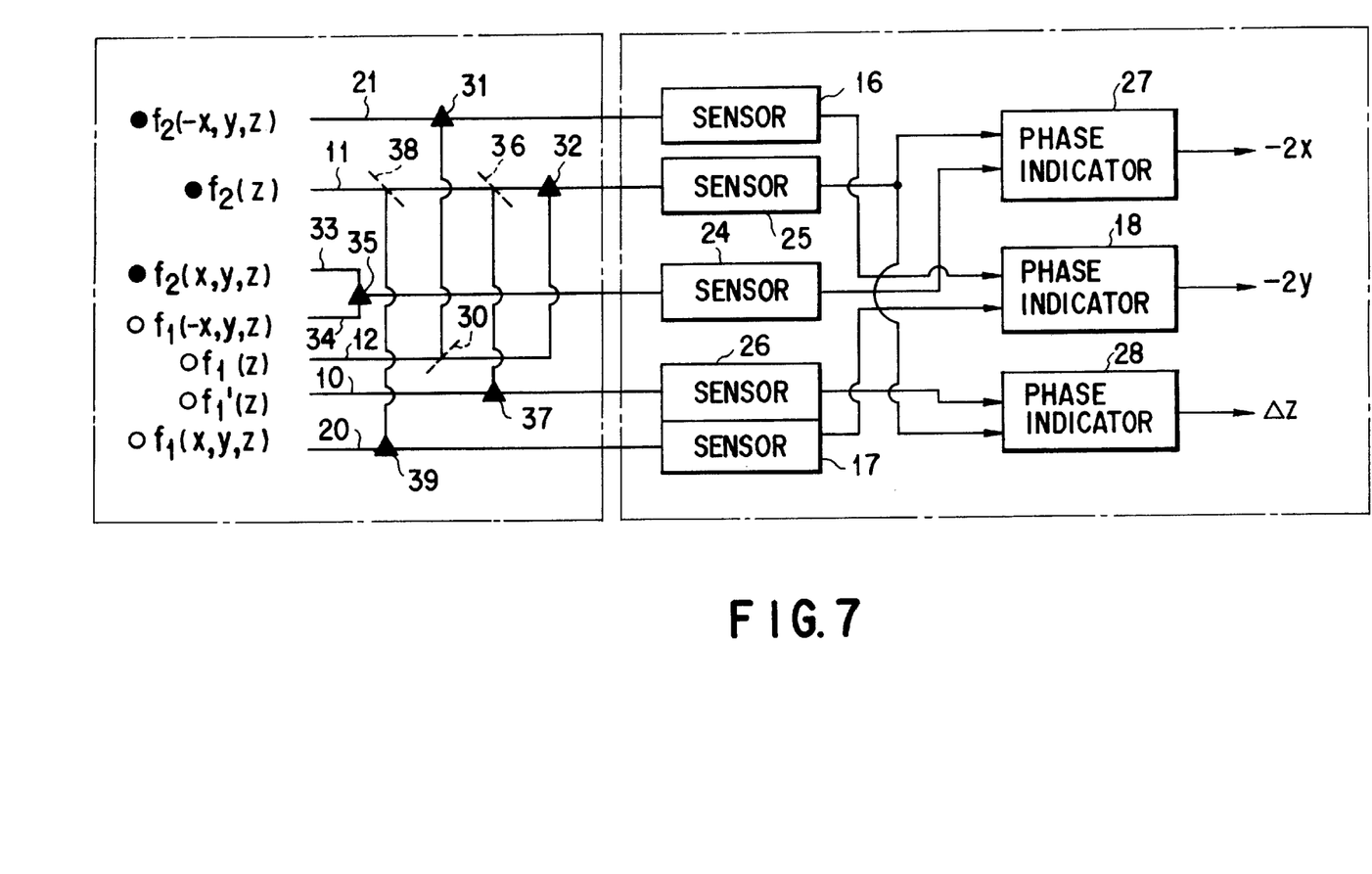
FIG. 7 is a schematic view of the constitution of the light-receiving side of the device when the displacements in the X, Y and Z directions are detected.

If, as in the above, the diffracted light beams are synthesized by the combinations shown in FIG. 7, the beat signals are generated by sensors 16, 17, 24, 25 and 26, and the phase differences are detected by phase indicators 18, 27 and 28, the displacements of X, Y and Z are measured independently.

The flux 21 of diffracted light beam $f_2(-x, y, z)$ and the flux, which is obtained by splitting the flux 12 of diffracted light beam $f_1(z)$ by a beam splitter (half mirror) 30, are synthesized with each other by a synthesizing section 31, and a beat due to an interference of wave is sensed by the sensor 16. The flux 11 of diffracted light beam $f_2(z)$ and the flux 12 of diffracted light beam $f_1(z)$ are synthesized by a synthesizing section 32, a beam due to an interference of wave is sensed by the sensor 25. Further, a flux 33 of diffracted light beam $f_2(x, y, z)$ and a flux 34 of diffracted light beam $f_1(-x, y, z)$ are synthesized by a synthesizing section 35, a beam due to an interference of wave is sensed by the sensor 24.

The flux 10 of diffracted light beam $f_1'(z)$ and the flux, which is obtained by splitting the flux 11 of diffracted light beam $f_2(z)$ by a half mirror 36, are synthesized with each other by a synthesizing section 37, and a beat due to an interference of wave is sensed by the sensor 26. Moreover, the flux 20 of diffracted light beam $f_1(x, y, z)$ and the flux, which is obtained by splitting the flux 11 of diffracted light beam $f_2(z)$ by a half mirror 38, are synthesized with each other by a synthesizing section 39, and a beat due to an interference of wave is sensed by the sensor 17.

If a phase difference between a beat signal output from the sensor 25 and that output from the sensor 24 is measured by a phase indicator 27, a displacement signal (−2x) in the X direction is produced. Furthermore, if a phase difference between a beat signal output from the sensor 16 and that output from the sensor 17 is measured by the phase indicator 18, a displacement signal (−2y) in the Y direction is obtained. Similarly, if a phase difference between a beat signal output from the sensor 26 and that output from the sensor 25 is measured by a phase indicator 18, a displacement signal (Δz) in the Z direction is produced.

The above constitution allows the displacements in the X, Y and Z directions to be measured independently. Therefore, both a position of the measurement face of a sample placed on a stage and a position of the stage can be detected by an electron beam patterning apparatus, thus achieving a high-precision sample face position detecting device free of a damage of resist due to an electron beam and an influence of beam drift, and a method for detecting the same.

(Second Embodiment)

Figure 8:
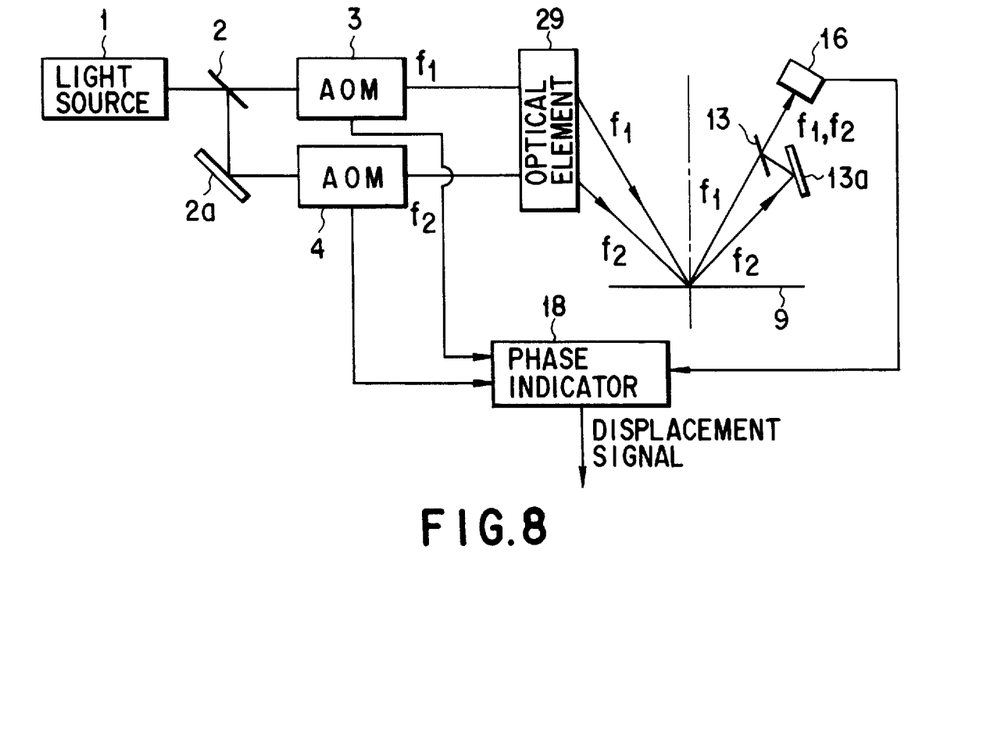
FIG. 8 is a block diagram illustrating an optical position detector according to a second embodiment of the present invention.

FIG. 8 is a block diagram illustrating a structure of a sample face position detector according to a second embodiment of the present invention.

A laser beam is emitted from a light source 1 and split into first and second fluxes by a beam splitter 2. The first flux is sent to an acoustic optical modulator (AOM) 3, while the second flux is sent to an acoustic optical modulator 4 through a mirror 2a. These fluxes are modulated by frequencies $f_1$ and $f_2$ which are slightly different from each other. The measurement face of a sample 9 is irradiated with the fluxes emitted from the AOMs 3 and 4 through an optical element 29 such as a folded mirror and a lens.

The fluxes are reflected by the measurement face and synthesized with each other by a half mirror 13 and a mirror 13a, and a beat due to an interference of wave is detected by a sensor 16. A beat signal and driving electrical signals of the AOMs generated from the sensor 16, are input to a phase indicator 18 thereby to produce a displacement signal.

In the second embodiment, the light-emitting side of the optical system generates no coherent fluxes of frequencies $f_1$ and $f_2$, but produces driving electrical signals from the AOMs 3 and 4 and inputs them to the phase indicator 18 as reference signals, thus generating a displacement signal. Even in the structure and method of the second embodiment, the same position detection as in the first embodiment is performed.

(Third Embodiment)

Figure 9:
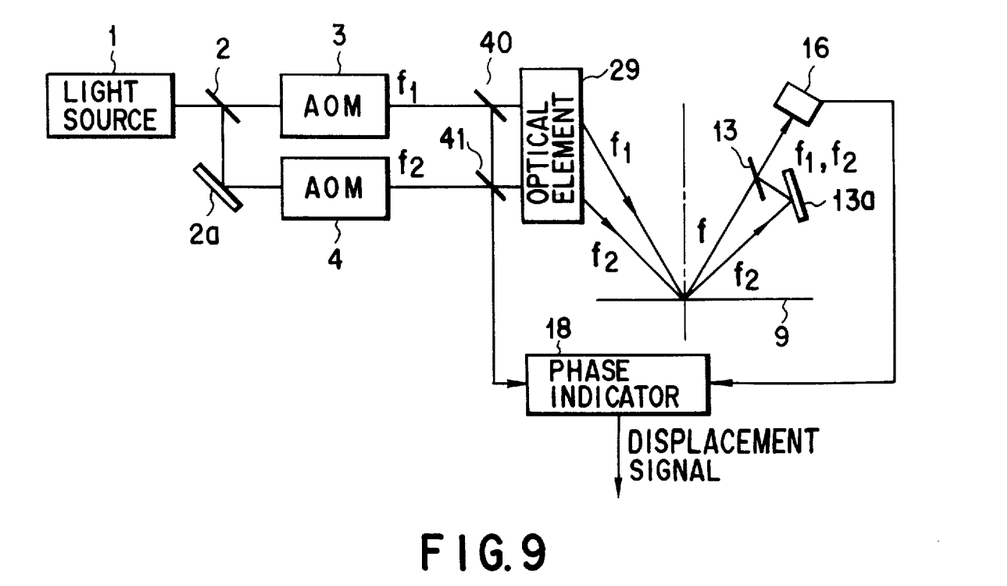
FIG. 9 is a block diagram illustrating an optical position detector according to a third embodiment of the present invention.

FIG. 9 is a block diagram illustrating a structure of a sample face position detector according to a third embodiment of the present invention.

In the third embodiment, the fluxes of frequencies $f_1$ and $f_2$ are caused to interfere with each other using half mirrors on the light receiving side, and the coherent fluxes are detected as reference signals. The reference signals and the beat signal detected by the sensor 16 are input to the phase indicator 18 to generate a displacement signal. In the third embodiment, too, the same advantages as those of the first and second embodiments can be obtained.

In the first to third embodiments as shown in FIGS. 2, 8 and 9, the split angle between two fluxes is small depending upon the detection range and the angle of placement of the optical system, and the fluxes are considered to be difficult to completely split. In this case, it is desirable to insert a deflector plate in one of the fluxes on the light-receiving side in order to cause the deflection direction of one of the fluxes to differ from that of the other flux. The two fluxes are split by a deflection beam splitter on the light-reflecting side and make the deflection directions thereof coincident with each other using the deflector plate again, thus synthesizing the fluxes with each other. In the first to third embodiments, the "deflection" means deflection such as P polarized light and S polarized light. The split method using such deflection allows the fluxes to be split or synthesized easily even at a split angle of not more than 1 degree.

(Fourth embodiment)

Figure 10:
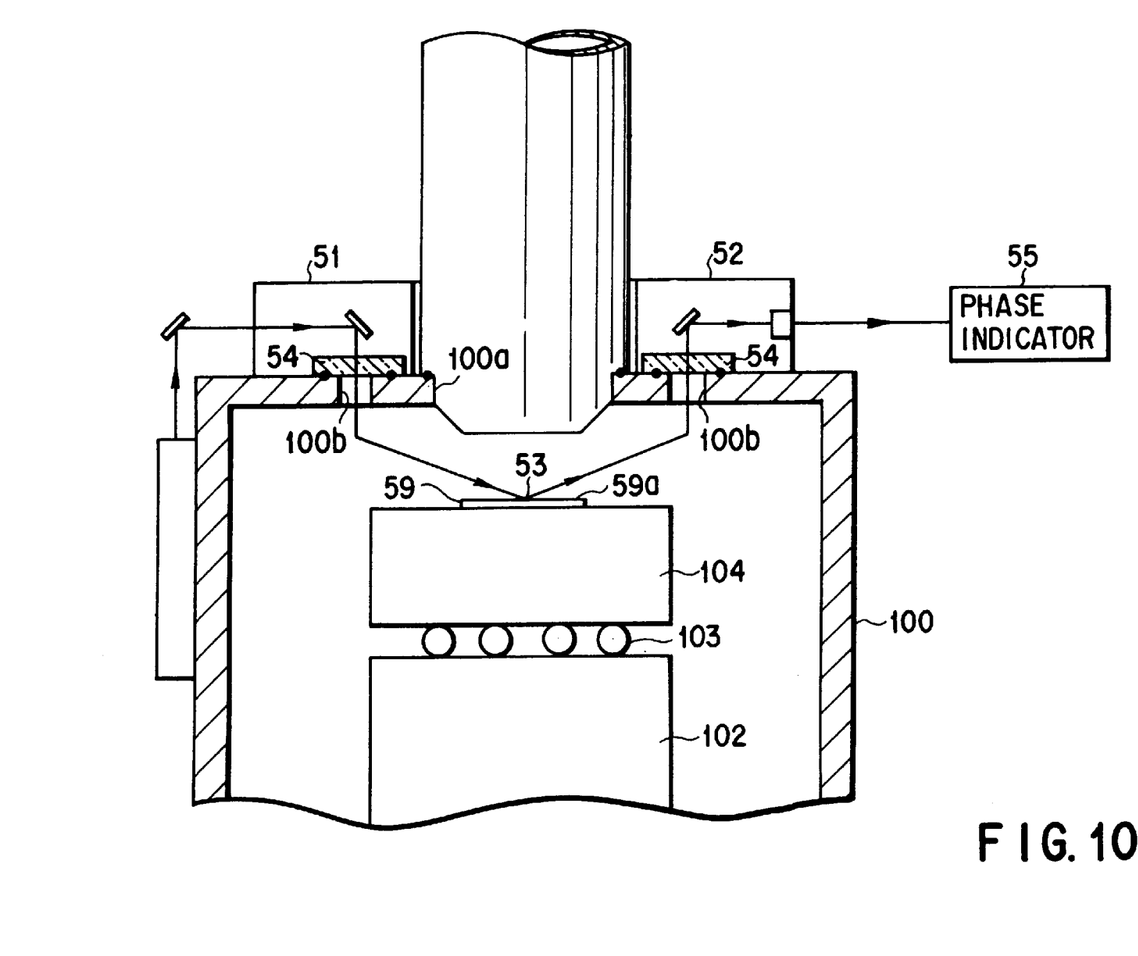
FIG. 10 is a view illustrating an electron beam exposure apparatus mounted with an optical XYZ sensor according to a fourth embodiment of the present invention, as an example of an apparatus for emitting a beam to a sample used for manufacturing a semiconductor device.

FIG. 10 illustrates a device for emitting a beam to a sample used for manufacturing a semiconductor device according to a fourth embodiment of the present invention. This device is an electron beam exposure device mounted with an optical XYZ sensor.

As shown in FIG. 10, an opening 100a is formed at one end of a vacuum chamber 100 and provided with a beam emitting system. A table 102 is disposed in the vacuum chamber 100, and a sample moving mechanism 104 is placed on the table 102 with a guide 103 interposed therebetween. A sample 59 is put on the sample moving mechanism 104 and can be moved up and down, right and left (in x, y and z directions) by the table 102, guide 103 and sample moving mechanism 104.

Another opening 100b is formed on the outer circumference of the opening 100a, and provided with a light-projecting section 51 and a light-receiving section 52, with a glass 54 for vacuum sealing interposed therebetween. The projecting section 51 has been described in detail in the first to third embodiments of the present invention. A high coherent laser beam is projected from the projecting section and split into at least three fluxes by a beam splitter or the like. These fluxes are modulated by AOMs 3 and 4 at frequencies $f_1$ (two fluxes) and $f_2$ (one flux) which are slightly different from each other. The three fluxes are emitted to the face 59a of a sample 59 obliquely at an incident angle θ. A special mark 53 is formed on the face 59a of the sample 59. The light beams reflected or diffracted by the mark 53 are guided to the light-receiving section 52.

If the reflected light beams or diffracted light beams are synthesized using a half mirror ($f_1$ and $f_2$), a beat due to an interference of wave can be sensed by a sensor. If a phase difference between a beat signal and a reference signal is detected using a phase indicator 55, the position (x, y, z) of the face of a sample, which is proportionate to the phase difference, can be known. No marks are need since it is only the regular reflected light that is required for detecting the height (z). An interface between the air and vacuum sides of the fluxes sent from the projecting section 51 and receiving section 52, is formed through vacuum seal of the glass 54.

If the special mark 53 is formed in that portion of the sample face 59a which is irradiated with a processing beam, the position in the xy directions detected by the processing beam and that in the xyz direction detected by the xyz sensor can be measured at once for a short time to such an extent that a drift of the processing beam can be ignored.

Figure 11:
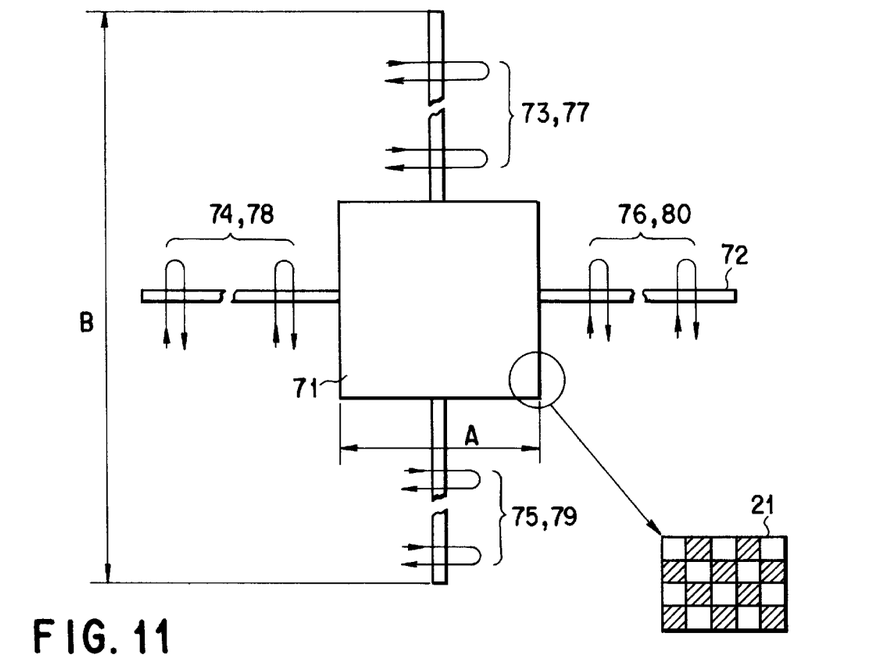
FIG. 11 is a view illustrating an example of a special mark used in the fourth embodiment.

FIG. 11 shows an example of the special mark. In FIG. 11, an enlarged two-dimensional mark 71 is shown in the central part and a linear mark 72 is shown near the mark 71. The size of the mark 71 is about several hundreds of $\mu$m (indicated by A), while the outside dimension of the mark 72 is a little less than 1 mm (indicated by B). The linear mark 72 is used to roughly match the marks and its size can be changed freely.

The size of the two-dimensional mark 71 can be varied with the shape of an emitted beam. The linear mark 72 can be shaped as a single pattern or a mark similar to the mark 71. Such a shape depends upon algorithm of rough matching, it does not matter how the pattern is shaped. In short, the object of the present invention can be attained if the patterns for rough matching and those for positional determination are mixed together.

First, the positions of marks placed on the table or the sample are roughly determined by scanning positions 73, 74, 75 and 76 of the table in the x and y directions using the optical detector. The number of scans and the position of scan can be changed appropriately when the need arises, and they can be obtained based on the measurement results of quantity of light and intensity of diffracted light of the XYZ sensor. Various methods can be utilized.

The exact position (x1, y1, z1) of the sample is detected by the central mark 71 based on the above information. Since the sample is not coated with resist or the like in the position detection on the table, the sample can be irradiated with highly-accelerated electron beams. In parallel with the positional detection by the XYZ sensor, the positions in the x and y directions are detected in a short time by deflection of electron beams in, e.g., positions 77 to 80 in FIG. 11. Generally, the center of the mark is obtained by adequately processing a signal using a reflected electron detector.

Based on both the positions in X and Y directions detected using an optical detector with respect to height z1 in the present z-direction and those in X and Y directions detected by electron beams, differences corresponding to x2−x1, y2−y1 (for z1) are stored by an appropriate method. This is performed in a considerably short time and thus a correlation between the positions can exactly be obtained.

The same detection as above is performed for height z2. It is convenient to prepare a mark with a step ($\Delta z$) on the table. In other words, information corresponding to x2–x1, y2–y1 (for z1) are detected by an appropriate method. It is thus possible to obtain numeric values necessary for positioning of both having a z-direction dependency. If positional information necessary for correcting the numeric values is stored in the optical detector, the positioning can be done perfectly.

Figure 12:
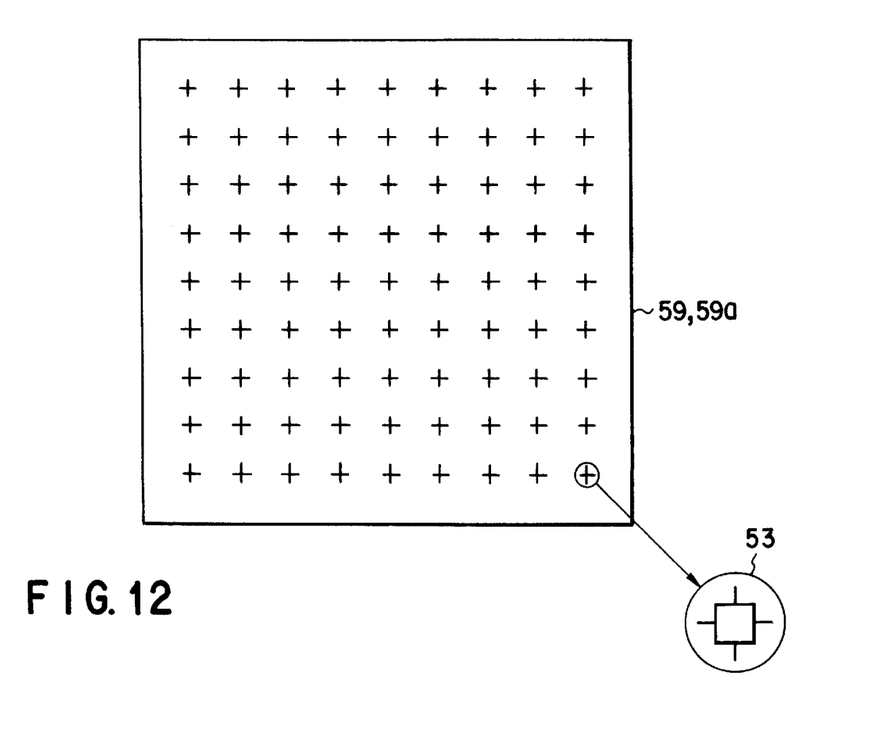
FIG. 12 is a diagram showing a group of marks drawn on a substrate.

A mark group corresponding to the special mark is written or processed on the sample with a relationship in position as illustrated in FIG. 12. The processed sample is put on the table again, and the position of the mark is detected exactly by the optical XYZ sensor along with correction in z direction. If the position (xij, yij) of the mark is so detected, correct writing and precise processing can be achieved by various metrological methods.

Since, in the second embodiment, a laser beam is adopted as a position detecting light source, no drift is caused due to charge-up or no damage is caused to resist, with the result that a stable signal can be obtained. Since, moreover, the positions of the sample face in its height and moving directions can simultaneously be detected by the optical system, the correct position in the x and y directions can be calculated, and the position of the mark can be detected with highest precision.

Conventionally, a drift of electron beams could not be detected correctly, but it can be done in the present invention. Furthermore, conventionally, a group of marks formed on the whole sample face was sensed by electron beams and used for pattern precision detection, but the pattern precision detection can be performed very correctly based on one mark, thus making it possible to detect the position of a sample with high precision without complicating the constitution of the apparatus.

The present invention is not limited to the above embodiments. The embodiments are applied to an electron beam exposure apparatus; however, the present invention can be applied to a laser exposure apparatus, a stepper, and an electron beam direct patterning apparatus. It can also be applied to an ion beam processing system for etching a sample face or forming a thin film on the sample face using focused ion beams. Various changes and modifications can be made without departing from the scope of the subject matter of the present invention.

As described above in detail, the present invention provides an optical position detector includes projecting means for projecting at least coherent light to the surface of a sample, light-receiving means for guiding light, which is reflected or diffracted by the surface of the sample, to a detector, and control means for converting a signal output from the light-receiving means into signals in x, y and z directions. With this constitution, the positions in the x, y and z directions can correctly be detected at the same time, and an apparatus mounted with the sensor can be improved in exposure precision and processing precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A beam exposure apparatus having an optical position detector which comprises:

a light emitter for emitting a plurality of coherent light beams onto a to-be-exposed sample;

a photoreceptor arranged at a position opposite the light emitter, with the sample interposed therebetween, the plurality of coherent light beams being reflected by the sample and received by the photoreceptor as a plurality of diffracted light beams; and a phase indicator for calculating phase differences of the plurality of diffracted light beams on the basis of outputs of the photoreceptor, the phase differences representing X, Y and Z positions of the sample.

2. The apparatus according to claim 1, wherein said optical position detector includes:

means for emitting at least two coherent light beams to a measurement face of the sample;

means for guiding two light fluxes, which are reflected or diffracted by the measurement face of the sample, to a detector; and means for detecting a phase of a beat caused by an interference of wave of the two fluxes of different frequencies guided to the detector, thereby to detect both a position of the sample in a direction normal to the measurement face of the sample and a displacement in each of two directions crossing within the measurement face of the sample.

3. The apparatus according to claim 1, wherein said optical position detector includes:

sample face irradiating means for irradiating a plane, which is defined by one of displacement detection directions parallel with the measurement face of the sample and a direction normal to the measurement face, with at least two fluxes from different directions and at least one flux at an angle different from the direction normal to the measurement face, the measurement face of the sample having a grating of diffracted light beams distributed two-dimensionally;

optical means for synthesizing two fluxes of light, which is reflected and diffracted by the grating of the measurement face of the sample, so as to interfere with each other; and measurement means for measuring a phase difference between a reference signal having a frequency corresponding to a beat due to an interference of wave of the two fluxes and a signal of the beat, thereby to detect a position of the sample in the direction normal to the measurement face of the sample and a displacement of the sample in each of two directions crossing within the measurement face of the sample.

4. The apparatus according to claim 1, wherein said optical position detector includes:

means for emitting at least two coherent light beams to a measurement face of a sample;

means for guiding two fluxes, which are reflected or diffracted by the measurement face of the sample, to a detector; and means for detecting a phase of a beat caused by an interference of wave of the two fluxes of different frequencies guided to the detector, thereby to detect a position of a stage for moving a sample provided in a pattern forming device using a charged particle beam or a position of the measurement face of a sample placed on the stage.

5. The apparatus according to claim 1, wherein said optical position detector includes:

first means for generating at least two coherent light beams modulated at slightly different frequencies;

second means for emitting said at least two coherent light beams to a measurement face of a sample;

third means for receiving at least two light beams reflected or diffracted by the measurement face of the sample;

fourth means for selectively synthesizing said at least two light beams by performing an optical operation thereby to generate an optical signal;

fifth means for converting the optical signal into an electrical signal; and sixth means for calculating a phase difference between the electrical signal and a reference signal, thereby to detect a position of the sample in a direction normal to the measurement face of the sample and a displacement of the sample in each of two directions crossing within the measurement face of the sample.

6. The apparatus according to claim 1, wherein said optical position detector executes:

a first step of generating at least two coherent light beams modulated at slightly different frequencies;

a second step of emitting said at least two coherent light beams to a measurement face of a sample;

a third step of receiving at least two light beams reflected or diffracted by the measurement face of the sample;

a fourth step of selectively synthesizing said at least two light beams by performing an optical operation thereby to generate an optical signal;

a fifth step of converting the optical signal into an electrical signal; and a sixth step of calculating a phase difference between the electrical signal and a reference signal, thereby to detect a position of the sample in a direction normal to the measurement face of the sample and a displacement of the sample in each of two directions crossing within the measurement face of the sample.

7. The apparatus according to claim 1, wherein said optical position detector has means for transmitting/receiving light to/from a mark formed in the sample, and wherein said mark includes a two dimensional mark and a linear mark formed near the two dimensional mark.

8. The apparatus according to claim 1, wherein said beam emitting system includes means for driving any one of a mask forming electron beam exposure apparatus, a laser exposure apparatus, a stepper, and an electron beam direct patterning apparatus.

\* \* \* \* \*

UNITED STATES PATENT AND TRADEMARK OFFICE
CERTIFICATE OF CORRECTION

PATENT NO. : 6,239,443 B1  Page 1 of 1
DATED : *May 29, 2001
INVENTOR(S) : Tojo et al.

It is certified that error appears in the above-identified patent and that said Letters Patent is hereby corrected as shown below:

<u>Title page, Item [54], and Column 1, line 1,</u>
should read:
-- [54] APPARATUS FOR EMITTING A BEAM TO A SAMPLE USED FOR MANUFACTURING A SEMICONDUCTOR DEVICE --

Signed and Sealed this

Nineteenth Day of February, 2002

Attest:

JAMES E. ROGAN
Attesting Officer    Director of the United States Patent and Trademark Office